US012787332B2

(12) United States Patent
Liu

(10) Patent No.: US 12,787,332 B2
(45) Date of Patent: Nov. 3, 2026

(54) FIN TRANSISTOR STRUCTURE AND METHOD FOR MANUFACTURING SAME

(71) Applicant: CHANGXIN MEMORY TECHNOLOGIES, INC., Hefei City (CN)

(72) Inventor: Youming Liu, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 865 days.

(21) Appl. No.: 18/166,477

(22) Filed: Feb. 8, 2023

(65) Prior Publication Data

US 2024/0055504 A1 Feb. 15, 2024

Related U.S. Application Data

(63) Continuation of application No. PCT/CN2022/118318, filed on Sep. 13, 2022.

(30) Foreign Application Priority Data

Aug. 15, 2022 (CN) ......................... 202210974812.0

(51) Int. Cl.
*H10D 30/62* (2025.01)
*H10D 30/01* (2025.01)
(Continued)

(52) U.S. Cl.
CPC ......... *H10D 30/024* (2025.01); *H10D 30/608* (2025.01); *H10D 30/6211* (2025.01);
(Continued)

(58) Field of Classification Search
CPC ............ H10P 30/20-28; H10D 30/024; H10D 30/62; H10D 30/6211; H10D 84/0158;
(Continued)

(56) References Cited

U.S. PATENT DOCUMENTS 9,318,608 B1 4/2016 Harley
9,343,371 B1 * 5/2016 Wu .................... H10D 30/0241
(Continued)

FOREIGN PATENT DOCUMENTS

CN 102664151 A * 9/2012
CN 107958873 A 4/2018
(Continued)

OTHER PUBLICATIONS

Matsukawa, Takashi, et al. "Damageless and conformai doping for FinFETs by spin-coated phosphorus doped silica." 2018 International Symposium on VLSI Technology, Systems and Application (VLSI-TSA). IEEE, 2018. https://ieeexplore.ieee.org/stamp/stamp.jsp?arnumber=8403820 (Year: 2018).*
(Continued)

*Primary Examiner* — Britt Hanley
*Assistant Examiner* — Jason James Greaving
(74) *Attorney, Agent, or Firm* — Syncoda LLC; Feng Ma

(57) ABSTRACT

A method for manufacturing a fin transistor structure includes the following: a substrate is provided, a fin part protruding from a top surface of the substrate; an isolation layer is formed on the substrate, a top surface of the isolation layer being lower than a top of the fin part, so that an upper part of the fin part is exposed above the isolation layer; and doping processing is performed on the upper part of the fin part by a diffusion process to form at least one of a source region or a drain region in the upper part of the fin part.

15 Claims, 11 Drawing Sheets

(51) Int. Cl.

| | |
|---|---|
| ***H10D 30/60*** | (2025.01) |
| ***H10D 62/13*** | (2025.01) |
| ***H10P 32/10*** | (2026.01) |
| ***H10P 32/12*** | (2026.01) |

(52) U.S. Cl.
CPC ........... *H10D 62/151* (2025.01); *H10P 32/12* (2026.01); *H10P 32/171* (2026.01)

(58) Field of Classification Search
CPC ............... H10D 84/834; H10D 84/853; H10D 86/011; H10D 86/215; H10D 84/0193
See application file for complete search history.

(56) References Cited

U.S. PATENT DOCUMENTS

| | | | | |
|---|---|---|---|---|
| 10,084,070 | B2 | 9/2018 | Basker | |
| 10,431,670 | B2 | 10/2019 | Tsai | |
| 2016/0093740 | A1 | 3/2016 | Harley et al. | |
| 2016/0365432 | A1 | 12/2016 | Basker et al. | |
| 2017/0250278 | A1* | 8/2017 | Tsai | H10D 30/024 |
| 2018/0108574 | A1 | 4/2018 | Li | |
| 2018/0175170 | A1* | 6/2018 | Tsai | H10D 30/024 |
| 2019/0244867 | A1 | 8/2019 | Li | |
| 2020/0035812 | A1 | 1/2020 | Tsai et al. | |
| 2021/0226035 | A1* | 7/2021 | Chang | H10D 30/0243 |

FOREIGN PATENT DOCUMENTS

| | | | |
|---|---|---|---|
| CN | 108231885 | A | 6/2018 |
| CN | 109994547 | A | 7/2019 |
| CN | 113348532 | A | 9/2021 |

OTHER PUBLICATIONS

N. D. Nguyen et al., Use of p- and n-type vapor phase doping and sub-melt laser anneal for extension junctions in sub-32 nm CMOS technology, Thin Solid Films (2010), vol. 518, pp. S48-S52.

* cited by examiner

FIN TRANSISTOR STRUCTURE AND METHOD FOR MANUFACTURING SAME

CROSS-REFERENCE TO RELATED APPLICATIONS

This is a continuation of International Patent Application No. PCT/CN2022/118318 filed on Sep. 13, 2022, which claims priority to Chinese Patent Application No. 202210974812.0 filed on Aug. 15, 2022. The disclosures of the above-referenced applications are hereby incorporated by reference in their entirety.

BACKGROUND

With the rapid development of semiconductor manufacturing technology, the integration of semiconductor devices is getting higher and higher. As the most basic semiconductor device, with the increase of component density and integration of the semiconductor devices, a transistor continues to develop towards miniaturization.

As the size of the transistor becomes smaller and smaller, the length of a gate of a conventional planar transistor becomes narrower and narrower, and the control ability of the gate over channel current becomes weaker, resulting in a short channel effect, which affects the semiconductor performance of the semiconductor device. Therefore, a Fin Field-Effect Transistor (FinFET) has been developed. The FinFET forms a vertical “fin” structure on a semiconductor substrate to provide a channel, with a gate surrounding the top and sidewalls of the “fin” structure. A source and a drain are formed in the “fin” structure on both sides of the gate by ion implantation.

However, ion implantation may cause a lattice defect, affecting the performance of the transistor, and affecting the uniformity of surface junction depth of lightly doped source/drain formed in the “fin” structure.

SUMMARY

The present disclosure relates to the technical field of semiconductor devices, and in particular to a fin transistor structure and a method for manufacturing the same.

In order to solve at least one problem mentioned in the background art, the present disclosure provides a fin transistor structure and a method for manufacturing the same.

According to one aspect, the present disclosure provides a method for manufacturing a fin transistor structure, which may include the following operations.

A substrate is provided, and a fin part protrudes from a top surface of the substrate. An isolation layer is formed on the substrate, and the top surface of the isolation layer is lower than the top of the fin part, so that an upper part of the fin part is exposed above the isolation layer. Doping processing is performed on the upper part of the fin part by a diffusion process to form at least one of a source region or a drain region in the upper part of the fin part.

According to another aspect, the present disclosure provides a fin transistor structure, and the fin transistor structure is manufactured through the above method for manufacturing.

DETAILED DESCRIPTION

Figure 1:
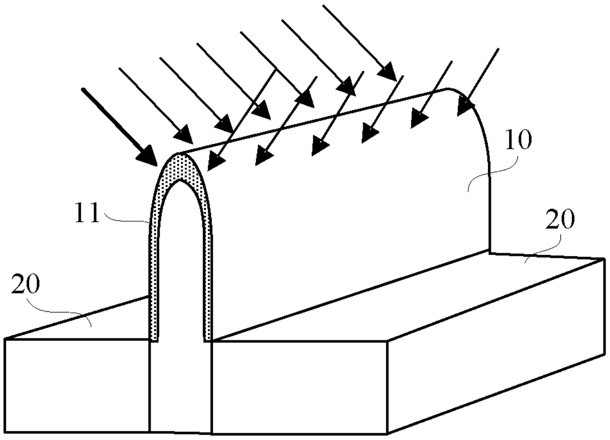
(Prior Art) FIG. 1
FIG. 1 is a schematic diagram of a Lightly Doped Drain (LDD) structure manufactured by an ion implantation process in some implementations.

A transistor serves as a basic device of an Integrated Circuit (IC). With the development of the IC towards higher integration, the number of transistors integrated in a unit area of the IC is more and more, and the transistors are becoming smaller and smaller.

For a conventional planar transistor, with the reduction of the volume of the transistor, the size (area) of a gate of the transistor becomes smaller and smaller, and the length of a channel of the transistor also decreases. The decrease of the length of the channel of the transistor may increase the driving strength (that is, increasing the drain current) and provide smaller parasitic capacitance, thus bringing the benefit of shortening the circuit delay. However, with the decrease of the length of the channel of the transistor, the length of the channel is close to a magnitude similar to the width of a depletion layer, and the control ability of the gate over the current in the channel becomes weak, which easily leads to a short channel effect, resulting in leakage current of a transistor and thus affecting the performance of the transistor.

In order to keep the miniaturization of the transistor and avoid the short channel effect, a transistor design has been proposed to replace the planar transistor, wherein a Fin Field-Effect Transistor (FinFET) is included and is called fin transistor for short. The fin transistor provides a channel by forming a convex “fin” structure on the surface of a substrate. A gate spans the “fin” structure and is surrounded at the top and both sides of the channel. Regions of the “fin” structure exposed at both sides of the gate form a source region and a drain region. The region of the “fin” structure covered by the gate serves as a channel region between the source region and the channel region. The gate changes the switching state of the transistor by controlling the channel region.

Compared with the planar transistor, the fin transistor enhances the control ability of the gate over the current in the channel region due to a wrapped structure of the gate, thus reducing the leakage current, inhibiting the short channel effect and improving the performance of the transistor.

Generally, after the gate is formed on the "fin" structure, the regions located on both sides of the gate in the "fin" structure are doped by an ion implantation process so as to form a source region and a drain region, and a region (i.e., a region covered by the gate) located between the source region and the drain region of the "fin" structure is used as a channel region. As a result, the fin transistor is finally formed.

However, in some implementations, when ion implantation doping is performed on both sides of the "fin" structure exposed outside the gate, the formed source/drain region usually has a serious lattice defect, which affects the performance of the transistor. Even if these defects are eliminated by laser annealing or position annealing after ion implantation, the lattice defect of the source/drain region cannot be completely eliminated by solid-state epitaxy with silicon in the substrate as seed crystal.

Furthermore, referring to FIG. 1, FIG. 1 schematically illustrates manufacturing of a Lightly Doped Drain (LDD) structure by ion implantation process. The arrows in the figure show irradiation directions of ion beams during ion implantation, and it is necessary to form a thin LDD layer 11 extending inward from the outer surface of the "fin" structure 10. Herein, the LDD layer 11 may be used as a lightly doped source region or an LDD region corresponding to the corresponding side of the "fin" structure 10. Since the "fin" structure 10 vertically raised on the surface of the substrate is doped by ion implantation, the irradiation directions of the ion beams are usually from both sides of the "fin" structure 10 to the "fin" structure 10 obliquely from top to bottom, so that the irradiation regions of the ion beams may cover the top and sidewalls of the "fin" structure 10.

It is to be noted that FIG. 1 does not show a main structure of the substrate, but only shows the "fin" structure 10 protruding from the surface of the substrate. Structural layers located on both sides of the "fin" structure 10 in the figure may be isolation layers 20, so that a subsequent gate structure (not shown in the figure) may be formed on the isolation layers 20.

However, due to the limitation of the oblique irradiation direction of the ion beam(s) from the top to the bottom of the "fin" structure 10, in the lightly doped LDD layer 11 formed by ion implantation, the surface junction depth (i.e., thickness of the LDD layer) of a top region of the "fin" structure 10 is often larger than the surface junction depth of a sidewall region of the "fin" structure 10. Thus, the surface junction depth of the LDD layer 11 is uneven, which affects the uniformity of the current flowing through the LDD layer 11 and further affects the performance of the fin transistor.

In view of this, embodiments of the disclosure provide a fin transistor structure and a method for manufacturing the same. In the method for manufacturing the fin transistor structure, an upper part of a fin part is subjected to doping processing by adopting a diffusion process so as to form a source/drain region on the upper part of the fin part. The diffusion process may reduce or even eliminate the lattice defect of the formed source/drain region, enable the surface junction depth of the formed lightly doped source/drain region to be more uniform, and thus the performance of the fin transistor structure is improved.

In order to make the purposes, technical solutions and advantages of the embodiments of the disclosure clearer, the technical solutions in the embodiments of the disclosure will be clearly and completely described below in combination with the drawings in the embodiments of the disclosure, and it is apparent that the described embodiments are only a part rather than all of embodiments of the disclosure. All other embodiments obtained by those of ordinary skill in the art based on the embodiments of the disclosure without creative efforts shall fall within the protection scope of the disclosure.

Figure 2:
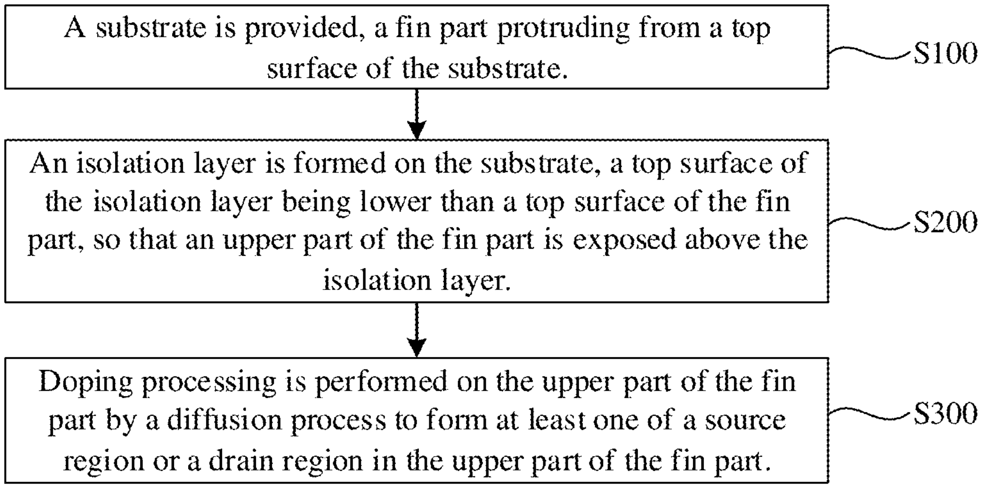
FIG. 2 is a flowchart of steps of a method for manufacturing a fin transistor structure according to an embodiment of the disclosure.

FIG. 2 is a flowchart of steps of a method for manufacturing a fin transistor structure according to an embodiment of the disclosure. Referring to FIG. 2, the embodiment of the disclosure provides a method for manufacturing a fin transistor. The method for manufacturing is used for manufacturing a fin transistor, and the fin transistor is applied to a semiconductor device. Taking a semiconductor memory as an example, the semiconductor device may be a Random Access Memory (RAM) or a Read-Only Memory (ROM). The RAM is, for example, a Static RAM (SRAM) or a Dynamic RAM (DRAM), and the ROM is, for example, a Programmable ROM (PROM), an Erasable Programmable ROM (EPROM) and an Electrically Erasable Programmable ROM (EEPROM).

The fin transistor may be a Silicon-on-Insulator (SOI) FinFET or a bulk FinFET. The SOI FinFET is formed on an SOI substrate and the bulk FinFET is formed on a bulk silicon substrate. Due to different manufacturing processes, compared with the FinFET formed on the SOI substrate, the FinFET formed on the bulk silicon substrate has many advantages, such as low cost, low defect density, and high thermal conductivity. Hereinafter, description is made below with the fin transistor being a bulk FinFET as an example.

As shown in FIG. 2, the method for manufacturing the fin transistor structure includes the following operations S100, S200, S300.

At S100, a substrate is provided, a fin part protruding from a top surface of the substrate.

Figure 3A:
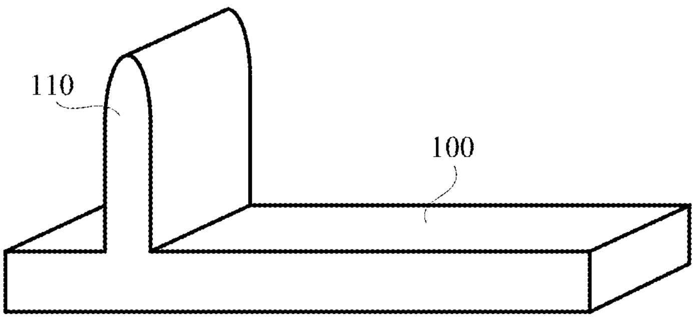
FIG. 3A is a structural diagram of forming a fin part on a substrate according to an embodiment of the disclosure.

FIG. 3A is a structural diagram of forming a fin part on a substrate according to an embodiment of the disclosure. Referring to FIG. 3A, a substrate 100 is provided first, and the substrate 100 may be a semiconductor substrate. For example, the substrate 100 is a monocrystalline silicon substrate, a polycrystalline silicon substrate, an amorphous silicon substrate, a monocrystalline germanium substrate, a silicon germanium substrate or a silicon carbide substrate. Herein, a fin part 110 is formed on the substrate 100 and protrudes on the top surface of the substrate 100. For example, the protruding direction of the fin part 110 may be perpendicular to the plane direction of a plane where the substrate 100 is located. That is, the fin part 110 vertically protrudes on the top surface of the substrate 100.

In some implementation modes, the fin structure 110 may be integrally formed on the substrate 100, and the material of the fin part 110 is the same as the material of the substrate 100. At this time, a substrate 100 with a flat plate structure may be first provided. For example, the substrate 100 is deposited by the above-mentioned semiconductor material. Then, downward etching is performed on the top surface of the substrate 100 to remove the material of other regions, except the fin structure 110, with a thickness corresponding to that of the fin part 110, so as to form the fin part 110 vertically raised on the top surface of the substrate 100.

In practical application, taking a semiconductor device with a fin transistor structure as an example, a semiconductor device is usually integrated with a plurality of fin transistor structures, and these fin transistor structures are arranged for example in an array. Accordingly, the fin parts 110 of the fin transistor structures are also arranged in an array on the surface of the substrate 100. In order to facilitate the formation of the fin part 110, the fin parts 110 may be formed at one time on the flat substrate 100 by a photolithography technique.

Specifically, a photoresist layer may be coated on the substrate 100, a mask plate is arranged on the photoresist layer, and the mask plate is provided with a mask opening 410. The photoresist (positive photoresist) in an exposed region or the photoresist (negative photoresist) in an unexposed region is dissolved and removed by an exposure development technique, and then the substrate 100 exposed outside the photoresist layer is etched to form the fin part 110.

Taking the photoresist layer adopting the positive photoresist as an example, a region corresponding to each of the fin parts 110 on the mask plate is provided with the mask opening 410, other regions on the mask plate are opaque, and ultraviolet light passes through the mask opening 410 and is irradiated to an exposed region of the photoresist layer. The exposed region of the photoresist layer corresponds to each fin part 110, and the photoresist in the exposed region is removed by a developing technique to expose the region corresponding to each fin part 110 on the surface of the substrate 100. At this time, the exposed region of the substrate 100 is etched to remove the part with a thickness of the substrate 100 in the exposed region, and the fin parts 110 are formed on the top surface of the substrate 100.

Contrary to the positive photoresist, if the photoresist layer adopts the negative photoresist, the region corresponding to each fin part 110 on the mask plate may be set as an opaque region, other regions on the mask plate are transparent, and other regions on the photoresist layer except for each fin part 110 form the exposed regions. The photoresist layer in the unexposed region is removed by the developing technology. That is, the photoresist layer corresponding to each fin part 110 is removed, and the regions corresponding to each of the fin part 110 on the surface of the substrate 100 are exposed. Then, the exposed region of the substrate(s) 100 is etched to remove the part with the thickness of the substrate 100 in the exposed region, and the fin parts 110 are formed on the top surface of the substrate 100.

It is to be understood that the exposure and development process of using ultraviolet light to irradiate the photoresist layer through the mask plate to transfer a mask pattern on the mask plate to the photoresist layer to form a photoresist layer pattern, and the process of etching the region not covered by the photoresist layer after forming the photoresist layer pattern are the same as or similar to the above process flow. The exposure, development and etching process that occurs after the embodiment is not described in detail.

Figure 3B:
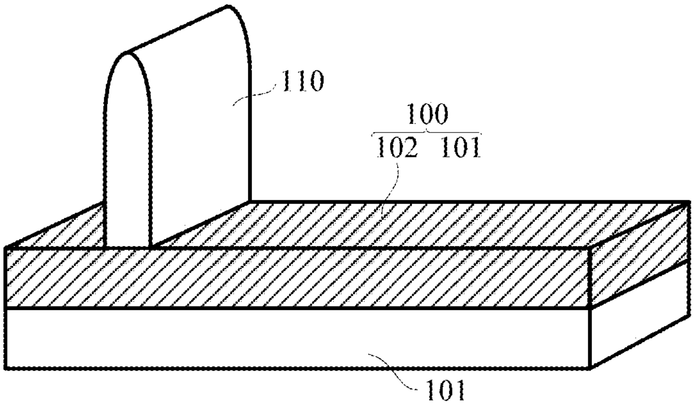
FIG. 3B is another structural diagram of forming a fin part on a substrate according to an embodiment of the disclosure.

FIG. 3B is another structural diagram of forming a fin part on a substrate according to an embodiment of the disclosure. Referring to FIG. 3B, in other implementation modes, for other purposes, the fin part 110 may also be formed on other structural layers on the substrate 100. For example, the substrate 100 defined in the embodiment may include a semiconductor substrate 101 and an insulating layer 102 laminated on the semiconductor substrate 101, and the fin part 110 is formed on the insulating layer 102. The fin part 110 may be formed by a semiconductor material. For example, the semiconductor material forming the fin part 110 may be monocrystalline silicon, polycrystalline silicon or silicon germanium material, etc.

Similar to the formation of the fin part 110 on the substrate 100, a whole semiconductor layer may be first formed on the insulating layer 102, and then materials in other regions of the semiconductor layer except the fin structure 110 may be etched by a photolithography technique so as to form fin part(s) 110 on the insulating layer 102, which is not described here.

At this time, since the fin part 110 is formed on the insulating layer 102, for a channel region in the fin part 110 (subsequently, the fin part 110 is doped to form a source region and a drain region on both sides of the fin part 110, and the region of the fin part 110 between the source region and the drain region is the channel region), the channel region is located on the insulating layer 102, and is formed on the SOI substrate similar to the fin part 110. Therefore, the fin transistor not only has the advantages of the bulk FinFET, but also can greatly reduce leakage current, and thus the performance of the fin transistor is improved.

Description is made below to the subsequent formation process of the fin transistor by taking the fin transistor formed on the substrate 100 shown in FIG. 3A as an example.

At S200, an isolation layer is formed on the substrate, and the top surface of the isolation layer is lower than the top of the fin part, so that the upper part of the fin part is exposed above the isolation layer.

Figure 4:
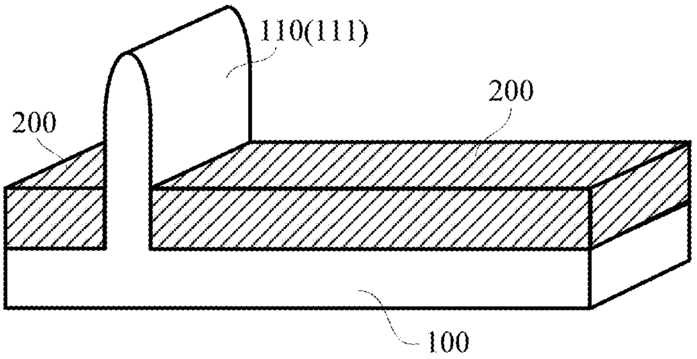
FIG. 4 is a structural diagram of forming an isolation layer on a substrate according to an embodiment of the disclosure.

FIG. 4 is a structural diagram of forming an isolation layer on a substrate according to an embodiment of the disclosure. Referring to FIG. 4, after the fin part 110 is formed on the substrate 100, an isolation layer 200 is first formed on the substrate 100. The thickness of the isolation layer 200 is smaller than the protruding height of the fin part 110. That is, the top surface of the isolation layer 200 is lower than the top of the fin part 110, and the upper part 111 of the fin part 110 is exposed above the isolation layer 200. The material forming the isolation layer 200 is, for example, silicon oxide, and the isolation layer 200 may be deposited by a deposition process. For example, the isolation layer 200 is deposited by a Chemical Vapor Deposition (CVD) process or a Physical Vapor Deposition (PVD) process.

For the substrate 100 made of the semiconductor material, the isolation layer 200 laminated on the substrate 100 is configured to isolate the adjacent fin part 110, so that the source region and the drain region subsequently formed in the fin part 110 are located in the upper part 111 of the fin part 110 (i.e., the part of the fin part 110 above the isolation layer 200), and the bottom of the fin part 110 (i.e., the region within the thickness range of the isolation layer 200) maintains the semiconductor characteristics. Equivalently, there is a semiconductor layer between the substrate 100 and the bottom region of the source/drain region of the fin part 110, which can significantly reduce the probability of leakage current between the source/drain regions of the adjacent fin part 110 and improve the electrical isolation performance of the fin part 110.

At S300, doping processing is performed on the upper part of the fin part by a diffusion process to form at least one of a source region or a drain region in the upper part of the fin part.

After the isolation layer 200 is formed on the substrate 100, the upper part 111 of the fin part 110 exposed on the isolation layer 200 is processed to dope the two side regions of the upper part 111 of the fin 110 to form the source region and the drain region. The two side regions refer to two side regions in the extension direction of the fin part 110, and the undoped region between the source region and the drain region is the channel region.

It is to be noted that, since doping is needed in both sides of the upper part 111 of the fin part 110, in order to more accurately form the source/drain region in the upper part 111 of the fin part 110, it is generally necessary to first form a gate structure (which is not shown in the figure) on the fin part 110. The gate structure covers a middle region of the channel region corresponding to the upper part 111 of the fin part 110, so as to define a region required to be doped in the upper part 111 of the fin part 110 through the gate structure. Herein, in the upper part 111 of the fin part 110, the regions located on both sides of the gate structure are regions required to be doped, and the regions on two sides are doped to form the source region and the drain region, respectively.

Herein, the gate structure may include a gate insulating layer (not shown in the figure) and a gate electrode layer (not shown in the figure). The gate insulating layer and the gate electrode layer are sequentially laminated on the outer surface of the upper part 111 of the fin part 110, and the gate insulating layer and the gate electrode layer are arranged corresponding to the channel region. Herein, the gate insulating layer may only cover the outer wall surface of the upper part 111 of the corresponding fin part 110, and the gate electrode layer may span a plurality of fin parts 110 along the arrangement direction of the fin parts 110 (i.e., arrangement direction along the width direction of the fin parts 110). That is, the plurality of fin parts 110 shares one gate electrode layer.

In addition, according to the structural design of the fin transistor, the arrangement of the gate structure on the fin part 110 may be different. Taking a fin transistor structure in a single gate structure as an example, a gate structure may be arranged on one fin part 110. Taking the fin transistor structure in a multi-gate structure as an example, along the extension direction of the fin part 110, a plurality of channel regions may be arranged in the fin part 110 at intervals, and correspondingly, a plurality of gate structures may be arranged on one fin part 110 at intervals. The gate structures correspond to the channel regions one by one.

Exemplarily, the gate insulating layer 102 may be made of $SiO_2$, SiN, SiON or other materials. The gate electrode layer may be made of polysilicon, or the gate electrode layer may be made of TiN, TiAlN, TaN or other metal materials.

For the convenience of explaining the subsequent doping process of the upper part 111 of the fin part 110, the gate structure covering the fin part 110 is not shown in FIG. 4 and subsequent figures, so it is to be considered that a length region of the fin part 110 shown in FIG. 4 and subsequent figures only corresponds to the source region or the drain region.

In the embodiment, doping processing is performed on the region corresponding to the source region/drain region in the upper part 111 of the fin part 110 by a diffusion process to form the source region/drain region on the upper part 111 of the fin part 110. The source region/drain region is formed by adopting a diffusion process, so that the lattice defect in the source region/drain region may be reduced or even eliminated. Moreover, for the formed lightly doped source region/drain region, the surface junction depth of the source region/drain region may be more uniform, and the performance of the fin transistor structure is improved.

As the fin part 110 is doped, as mentioned above, a semiconductor device is usually provided with a plurality of fin transistor structures. That is, a plurality of fin parts 110 are arranged on the top surface of the substrate 100 at intervals (such as in array arrangement). Therefore, before diffusion doping, it is necessary to define a diffusion region 300 so as to enable the diffusion region 300 to surround the periphery of the upper part 111 of the fin part 110. During doping, the region above the isolation layer 200 and located in the diffusion region 300 is doped, so that diffusion doping processing is performed on the upper part 111 of the fin part 110 located in the diffusion region 300, while other regions above the isolation layer 200 are not affected by doping.

Figure 5:
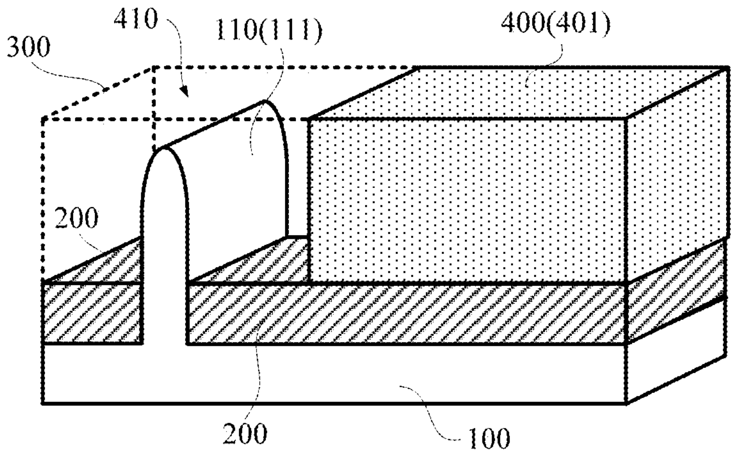
FIG. 5 is a schematic diagram of arranging a diffusion region on an isolation layer according to an embodiment of the disclosure.

FIG. 5 is a schematic diagram of arranging a diffusion region on an isolation layer according to an embodiment of the disclosure. Referring to FIG. 5, for defining a diffusion area 300 on the isolation layer 200, in some implementation modes, a mask layer 400 may be formed above the isolation layer 200, and the mask layer 400 is, for example, a photoresist layer 401. A mask opening 410 is formed in the mask layer 400, the mask opening 410 corresponds to the part where the fin part 110 is located, the fin part 110 is exposed in the mask opening 410, and the mask opening 410 forms the diffusion region 300.

During diffusion doping, the fin part 110 exposed in the mask opening 410 of the mask layer 400 may be doped, while other regions above the isolation layer 200 are covered by the mask layer 400. The diffusion doping process would not affect the other regions above the isolation layer 200.

In practical application, similar to the aforementioned photolithography process, a whole photoresist layer 401 may be arranged on the isolation layer 200 first, and the photoresist layer 401 covers not only other regions except the fin part 110, but also covers the region where the fin part 110 is located. Then, a mask plate is covered on the photoresist layer 401, an opening (which corresponds to a region where the fin part 110 is located or corresponds to other regions outside the fin part 110) is formed in the mask plate. The photoresist layer 401 corresponding to the region where the fin part is located is removed by the exposure development technique. As a result, the photoresist layer 401 forms the mask opening 410 in the region corresponding to the fin part 110, the fin part 110 is exposed in the mask opening 410, and other regions above the isolation layer 200 are still covered by the photoresist layer 401.

Since the process of diffusion doping the fin part 110 is a high-temperature process, and the stability of the photoresist layer 401 in a normal state is poor, in order to enable the photoresist layer 401 to play a stable protective role in its covered region, in the embodiment, after the photoresist layer 401 is formed on the isolation layer 200 and the mask opening 410 is processed on the photoresist layer 401, carbonization processing may be performed on the photoresist layer 401 to improve the strength and hardness of the photoresist layer 401, which ensures the stability of the photoresist layer 401 during diffusion doping of the fin part 110.

Figure 6A:
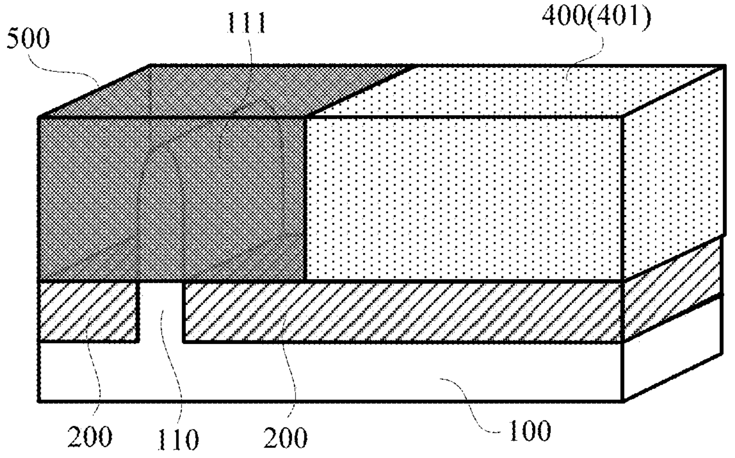
FIG. 6A is a schematic diagram of a manner of performing doping processing on an upper part of a fin part according to an embodiment of the disclosure.

FIG. 6A is a schematic diagram of a manner of performing doping processing on an upper part of a fin part according to an embodiment of the disclosure. Referring to FIG. 6A, as an implementation mode, doping gel 500 may be spin-coated in a diffusion region 300 so that the doping gel 500 covers the upper part 111 of the fin part 110. That is, the part of the fin part 110 exposed above the isolation layer 200 is wrapped by the doping gel 500. It is to be understood that the doping gel 500 contains a doping element that may enable the fin part 110 to form the source/drain region. After the doping gel 500 is coated, annealing processing is performed on the doping gel 500, so that the doping element in the doping gel 500 penetrates into the fin part 110 to form the source/drain region at the corresponding part of the fin part 110 covered by the doping gel 500.

Exemplarily, the doping element in the doping gel 500 includes one or more of phosphorus, boron, arsenic, lead and indium. It is to be understood that the formed fin transistor may be a PNP transistor or an NPN transistor depending on the difference of the doped elements. For example, the formed fin transistor is a silicon NPN transistor, a silicon PNP transistor, a germanium NPN transistor or a germanium PNP transistor.

In general, the doping gel 500 may be spin-coated on the diffusion regions 300 of the fin part 110 located on both sides of the gate structure at the same time, and annealing processing is performed on the doping gel 500 of the fin part 110 located on both sides of the gate structure at the same time, so as to form a source region and a drain region on parts of the fin part 110 located on both sides of the gate structure, respectively. Alternatively, in other cases, the doping gel 500 may be spin-coated on the diffusion region 300 of the fin part 110 located on one side of the gate structure at one time, and then annealing processing is performed on the doping gel 500 so as to form a source region or a drain region on the side of the fin part 110. Then, the doping gel 500 is spin-coated on the diffusion region 300 of the fin part 110 located on the other side of the gate structure, or other doping methods are adopted to form a drain region or a source region on the other side of the fin part 110.

After the doping gel 500 is spin-coated in the diffusion area 300, annealing processing is performed on the doping gel 500. On one hand, energy is provided to the doping process of the fin part 110, so that the doping element in the doping gel 500 enters the fin part 110 faster and thus the doping efficiency of the fin part 110 is improved. On the other hand, the annealing process may eliminate residual stress, stabilize the size and reduce the deformation and crack tendency of the fin part 110, and may enable the doping of the source/drain region to be more uniform, refine crystal grain, adjust lattice organization structure, reduce or even eliminate the lattice defect, and thus improve the performance of the fin transistor.

Specifically, the annealing time of the annealing process may be controlled at 5 s-2 h. For example, the annealing time may be 5 s, 30 s, 45s, 1 min, 5 min, 10 min, 15 min, 20 min, 30 min, 45 min, 1 h, 1.25 h, 1.5 h, 1.75 h, etc., which may be determined according to the doping concentration of the source/drain region required to be formed. The annealing temperature may be controlled between 700° C. and 1200° C. For example, the annealing temperature may be 750° C., 800° C., 850° C., 900° C., 950° C., 1000° C., 1050° C., 1100° C. and 1150° C., so as to obtain a source region/drain region with fine grains, uniform organization and less lattice defect.

Exemplarily, according to actual requirements, the annealing process may adopt laser anneal, spike anneal, soak anneal, and other processes. Taking the laser anneal as an example, a thermal budget (diffusion depth) of the diffusion process may be adjusted by adjusting parameters such as the concentration of $CO_2$ gas and laser energy during laser anneal, so as to control the doping concentration of the formed source/drain region.

Figure 6B:
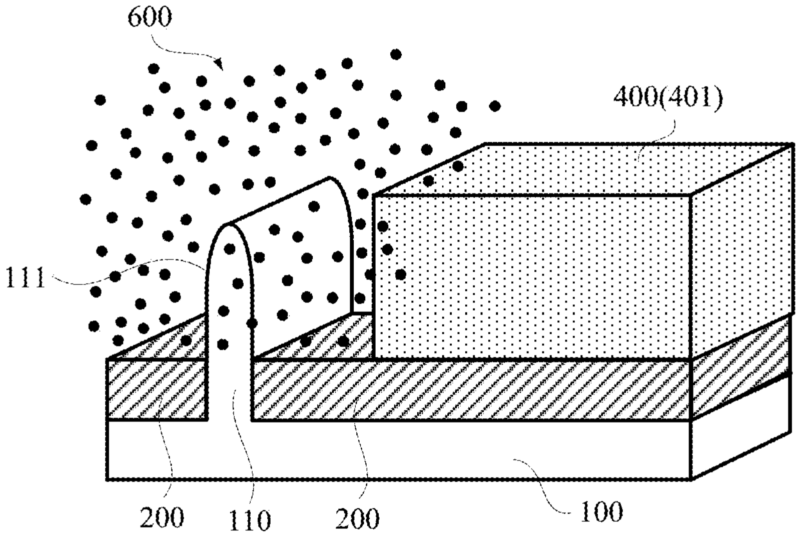
FIG. 6B is a schematic diagram of another manner of performing doping processing on an upper part of a fin part according to an embodiment of the disclosure.

FIG. 6B is a schematic diagram of another manner of performing doping processing on an upper part of a fin part according to an embodiment of the disclosure. Referring to FIG. 6B, as another implementation mode, doping gas 600 containing a doping element may be introduced into the diffusion region 300, and the doping gas 600 is enveloped around the upper part 111 of the fin part 110. At the same time, the diffusion region 300 is subjected to annealing processing, so that the doping element in the doping gas 600 penetrates into the fin part 110, so as to form a source/drain region in the fin part 110 corresponding to the diffusion region 300.

Herein, similar to spin-coating of the doping gel 500 in the diffusion region 300, the doping gas 600 may be introduced to the diffusion regions 300 of the fin part 110 located on both sides of the gate structure at the same time, and annealing processing is performed on the diffusion regions 300 of the fin part 110 located on both sides of the gate structure at the same time, so as to form a source region or a drain region on parts of the fin part 110 located on both sides of the gate structure, respectively. Alternatively, the regions of the fin part 110 located on both sides of the gate structure may be doped in sequence. At this time, both sides of the fin part 110 may be doped by introducing the doping gas 600, or one side of the fin part 110 may be doped by introducing the doping gas 600, while the other side may be doped by other doping manners.

Similarly, the doping element contained in the doping gas 600 may be one or more of the phosphorus, boron, arsenic, lead and indium as mentioned above. In the process of introducing the doping gas 600, the diffusion region 300 is subjected to annealing processing to provide energy for the doping process, which may improve the doping efficiency for the fin part 110, so that the doping of the source/drain region is more uniform, and the lattice defect of the formed source/drain region is eliminated, thereby improving the performance of the fin transistor.

In addition, the annealing process may employ the above-mentioned laser anneal, spike anneal, soak anneal and other processes, and the annealing time of the annealing process may be controlled at a range of 0.5 h-2 h, and the annealing temperature may be controlled at a range of 700° C.-1200° C., which is not repeated here.

Figure 7A:
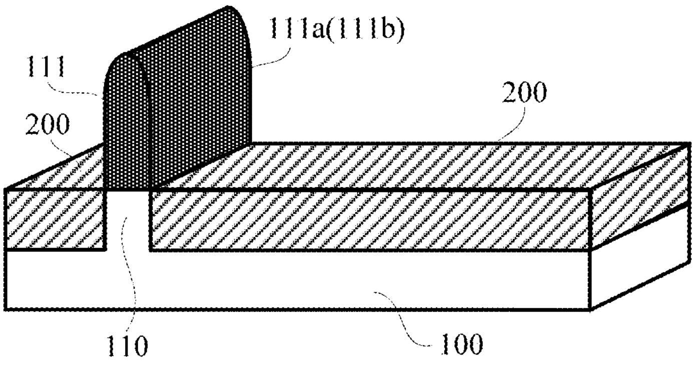
FIG. 7A is a structural schematic diagram of a formed source region/drain region according to an embodiment of the disclosure.
Figure 7B:
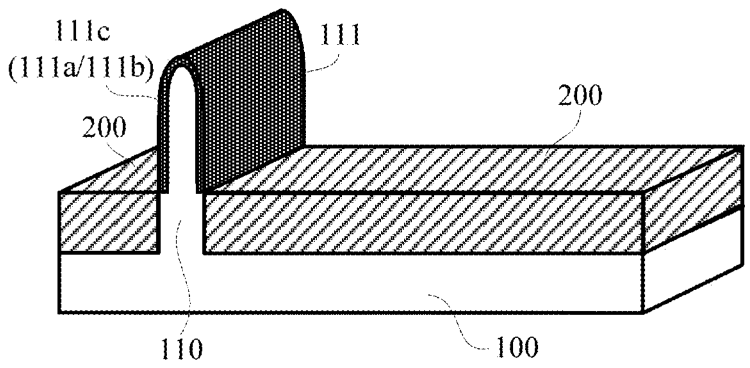
FIG. 7B is a structural schematic diagram of another source region/drain region according to an embodiment of the disclosure.

FIG. 7A is a structural schematic diagram of a formed source region/drain region according to an embodiment of the disclosure. FIG. 7B is a structural schematic diagram of another source region/drain region according to an embodiment of the disclosure. Referring to FIGS. 7A and 7B, according to the actual requirements, the parameters in the diffusion doping process may be controlled. For example, the concentration of the doping element in the doping gel 500 or in the doping gas 600 is controlled, the diffusion doping time is controlled, the annealing time, the annealing temperature, etc., in the annealing process are controlled, and the diffusion depth of the doping element in the fin part 110 may be controlled.

Referring to FIG. 7A, as an implementation mode, for the fin part 110 located in the diffusion region 300, the parameters in the diffusion doping process are controlled, so that the formed source region 111*a*/drain region 111*b* may occupy the entire thickness of the fin part 110. That is, the entire thickness of the fin part 110 located in the diffusion region 300 is a doped region. Thus, the cross-sectional area of the formed source region 111*a*/drain region 111*b* is large. When the fin transistor structure is in an open state, more current flows through the channel region, and the current carrying capacity of the fin transistor is high.

The formed source region 111*a*/drain region 111*b* occupies the entire thickness of the fin part 110. That is, the doped region occupies the entire thickness of the fin part 110. That is, the doping element fully diffuses in the fin part 110 and occupies a region of the entire thickness. In order to achieve full diffusion of the doping element in the fin part 110, the doping gel 500 or the doping gas 600 may be controlled to have a higher concentration of the doping element, and the annealing time of the annealing process may be appropriately prolonged or the annealing temperature of the annealing process may be increased, so that the doping element has a larger diffusion depth in the fin part 110, and a full diffusion effect is thus achieved.

Referring to FIG. 7B, as another implementation mode, for the fin part 110 located in the diffusion region 300, the parameters in the diffusion doping process are controlled, so that the formed source region 111*a*/drain region 111*b* may occupy part of the thickness of the fin part 110, and the source region 111*a*/drain region 111*b* is formed as an LDD region 111C extending inward from an outer wall of the upper part 111 of the fin part 110 by a preset thickness. That is, partial thickness of the part of the fin part 110 located in the diffusion region 300 facing inward from the outer wall is a doped region.

In practical application, the LDD region 111C may be introduced into an end part of the channel region close to the source region 111*a*/drain region 111*b*. The LDD region 111C may reduce the electric field distribution of the source region 111*a*/drain region 111*b* in the channel region, bear part of the source-drain voltage, so that the resistance of the fin transistor to hot carrier degradation is improved. In some cases, for example, under the low current-carrying requirement of the fin transistor, the entire extended region of the source region 111*a*/drain region 111*b* in the fin portion 110 may be the LDD region 111C, which is not limited in the embodiment.

The formed LDD region 111C only occupies partial thickness of the fin part 110 facing inward from the outer wall. That is, the doped region occupies partial thickness of the fin part 110 facing inward from the outer wall. In other words, the diffusion depth of the doping element in the fin part 110 is small. In order to achieve shallow diffusion of the doping element in the fin part 110, the doping gel 500 or the doping gas 600 may be controlled to have a lower concentration of doping element, and the annealing time of the annealing process may be shortened. For example, the doping gel 500 or the doping gas 600 in the diffusion region 300 is quickly heated to 1,000 K-1,500 K by adopting a rapid annealing process, and after reaching the requirement, the temperature rise keeps for several seconds, and then the annealing is finished, so as to form the LDD region 111C in the fin part 110.

Continuously referring to FIG. 7B, when the LDD region 111C is formed in the fin part 110, the lattice defect of the LDD region 111C may be reduced or even eliminated by adopting the diffusion process of the embodiment. Moreover, the surface junction depth of the LDD region 111C may be made more uniform, and the surface junction depths of a top region and a sidewall region of the upper part 111 of the fin part 110 are almost the same, which ensures the uniformity of the current flowing through the LDD region 111C. Therefore, the performance of the fin transistor may be improved.

In order to adjust the electrical characteristics of the fin transistor structure, in some implementation modes, the turn-on voltage of the gate structure may be adjusted by adjusting the area of the fin part 110 covered by the gate structure. For example, the gate structure may cover only partial region of the upper part 111 of the fin part 110, and the gate structure covers a part of a height region downward from the top of the fin part 110, and there is a distance between the gate structure and the isolation layer 200.

Figure 8:
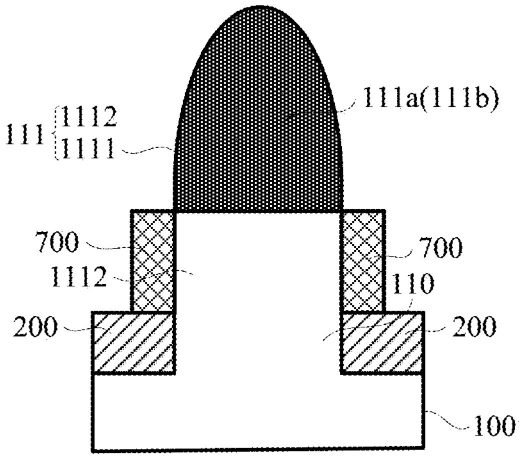
FIG. 8 is a schematic cross section of a fin part according to an embodiment of the disclosure.

FIG. 8 is a schematic cross section of a fin part according to an embodiment of the disclosure. Referring to FIG. 8, for the case where the gate structure only covers partial region of the upper part 111 of the fin part 110 and has a distance from the isolation layer 200, and correspondingly for the upper part 111 of the fin part 110 exposed on the isolation layer 200, the doping concentration of the source region 111*a*/drain region 111*b* in the fin part 110 may be reduced so that the formed source region 111*a*/drain region 111*b* only covers partial region of the upper part 111 of the fin part 110. In the fin part 110, the height region covered by the source region 111*a*/drain region 111*b* corresponds to the height region covered by the gate structure.

Herein, the upper part 111 of the fin part 110 may be divided into a top region 1111 and a bottom region 1112 along the height direction of the fin part 110 (i.e., the extending direction of the fin part 110). The bottom region 1112 is a height region of the fin part 110 extending upward from the surface of the isolation layer 200. That is, the bottom region 1112 is close to the top surface of the substrate 100, and the top region 1111 is a height region between the upper end of the bottom region 1112 and the top end of the fin part 110. The source region 111*a*/drain region 111*b* formed by diffusion only covers the top region 1111 of the upper part 111 of the fin part 110, while the bottom region 1112 of the upper part 111 of the fin part 110 is undoped. As a result, the doping concentration of the source region 111*a*/drain region 111*b* is deduced, and the distance between the source region 111*a*/drain region 111*b* and the substrate 100 is increased.

Specifically, referring to FIG. 8, isolation parts 700 may be arranged on outer wall surfaces of both sides in the width direction of the bottom region 1112 of the upper part 111 of the fin part 110. That is, the isolation parts 700 are formed on the isolation layer 200, and the isolation parts 700 on both sides respectively cover the sidewall surfaces of the corresponding sides of the fin part 110, and the isolation parts 700 extend along the extension direction of the fin part 110. The isolation part 700 may be made of an insulating material such as $SiO_2$, SiN, and SiCN.

Isolation parts 700 are formed on both sides of the bottom region 1112 of the upper part 111 of the fin part 110. When the source region 111*a* or drain region 111*b* is formed by diffusion doping, because of being obstructed by the isolation part 700, the doping element in the diffusion region 300 diffuses into the top region 1111 of the upper part 111 of the fin part 110. The width of the fin part 110 is very small, so that the doping element basically diffuses laterally in the fin part 110. Therefore, the doped source region 111*a*/drain region 111*b* usually only covers the top region 1111 of the upper part 111 of the fin part 110.

It is to be understood that, although in FIG. 8, taking the doping element being fully diffused in the top region 1111 of the upper part 111 of the fin part 110 to form the source region 111*a*/drain region 111*b* covering the entire thickness of the top region 1111 of the upper part 111 of the fin part 110 as an example, as shown in FIG. 7*b*, the doping element may be lightly diffused in the top region 1111 of the upper part 111 of the fin part 110 by controlling the parameters in the diffusion doping process, so as to form the LDD region 111C in the top region 1111 of the upper part 111 of the fin part 110.

In addition, the disclosure also provides a fin transistor structure. The fin transistor structure is manufactured by the manufacturing method as mentioned above. The fin transistor structure formed by the above manufacturing method has few lattice defects. For the case having the LDD region, the uniformity of surface junction depth of the LDD region is good, and the performance of the fin transistor structure is better.

According to the fin transistor structure and the method for manufacturing the same provided by the disclosure, in the method for manufacturing a fin transistor, the upper part of the fin part is subjected to doping processing by adopting a diffusion process so as to form a source/drain region on the upper part of the fin part, so that the lattice defect in the source/drain region may be reduced or even eliminated. Moreover, for the lightly doped source/drain region, the surface junction depth of the source/drain region may be more uniform. Therefore, the performance of the fin transistor structure is improved.

In the descriptions of the disclosure, it is to be understood that the orientation or location relationships indicated by the terms “center”, “longitudinal”, “lateral”, “length”, “width”, “thickness”, “upper”, “lower”, “front”, “rear”, “left”, “right”, “vertical”, “horizontal”, “top”, “bottom”, “inner” and “outer” are orientation or location relationships shown on the basis of the drawings, which are only for the convenience of describing the disclosure and simplifying the descriptions, rather than indicating or implying that the referred apparatuses or elements must have a specific orientation, and be constructed and operated in a specific orientation. Therefore, they cannot be understood as a limitation to the present disclosure.

In the description of the disclosure, it is to be understood that terms “comprise” and “have” and any other variations thereof used herein are intended to cover a non-exclusive inclusion. For example, a process, method, system, product or device that includes a list of steps or units is not necessarily limited to only those steps or units but may include other steps or units not expressly listed or inherent to such process, method, product or device.

Unless otherwise specified and defined, terms “mounting”, “mutual connection”, “connection”, and “fixing” shall be generally understood. For example, the term may be fixed connection, or detachable connection, or integral connection. The term may also be direct connection, or indirect connection through an intermediate, or communication inside two elements, or interactive relationship between two elements. Those of ordinary skill in the art may understand the specific meanings of the terms in the disclosure according to specific conditions. In addition, terms “first”, “second”, etc. are only used for describing purposes, and cannot be understood as indicating or implying relative importance or implicitly indicating the number of indicated technical features.

Finally, it is to be noted that the above embodiments are only used to illustrate the technical solutions of the disclosure, but are not intended to limit them. Although the disclosure has been described in detail with reference to the foregoing embodiments, those of ordinary skill in the art should understand that the technical solutions described in the foregoing embodiments can still be modified or some or all of the technical features can be equivalently replaced. However, these modifications or substitutions do not make the essence of the corresponding technical solutions deviate from the scope of the technical solutions of various embodiments of the present disclosure.

What is claimed is:

1. A method for manufacturing a fin transistor structure, comprising:

providing a substrate, a fin part protruding from a top surface of the substrate;

forming an isolation layer on the substrate, a top surface of the isolation layer being lower than a top of the fin part, so that an upper part of the fin part is exposed above the isolation layer;

forming a mask layer on the isolation layer, the mask layer being provided with a mask opening, and the mask opening exposing the upper part of the fin and forming a diffusion region, wherein the diffusion region surrounding a periphery of the upper part of the fin part;

spin-coating doping gel in the diffusion region, the doping gel covering the upper part of the fin part; and performing annealing processing on the doping gel, to form at least one of a source region or a drain region in the upper part of the fin part; and removing the doping gel.

2. The method for manufacturing a fin transistor structure of claim 1, wherein performing annealing processing comprises:

controlling an annealing temperature in a range of 700° C.-1200° C. and controlling an annealing time in a range of 5 s-2 h.

3. The method for manufacturing a fin transistor structure of claim 1, wherein a doping element for the doping processing comprises one or more of phosphorus, boron, arsenic, lead, aluminum and indium.

4. The method for manufacturing a fin transistor structure of claim 1, wherein performing doping processing on the upper part of the fin part comprises:

forming a Lightly Doped Drain (LDD) region extending inward from an outer wall of the upper part of the fin part by a preset thickness, so as to form at least one of the source region or the drain region.

5. The method for manufacturing a fin transistor structure of claim 4, wherein the LDD region is formed by a rapid annealing process.

6. The method for manufacturing a fin transistor structure of claim 1, wherein performing doping processing on the upper part of the fin part comprises:

forming a doped region occupying a whole thickness of the upper part of the fin part, so as to form at least one of the source region or the drain region.

7. The method for manufacturing a fin transistor structure of claim 1, wherein performing a mask layer on the substrate comprises:

forming a photoresist layer on the substrate; and carbonizing the photoresist layer to form the mask layer.

8. The method for manufacturing a fin transistor structure of claim 1, wherein the upper part of the fin part comprises a top region and a bottom region, the bottom region being close to the top surface of the substrate, the top region being located above the bottom region, and at least one of the source region or the drain region being located in the top region.

9. The method for manufacturing a fin transistor structure of claim 8, wherein outer wall surfaces on both sides of the bottom region in a width direction are provided with isolation parts.

10. The method for manufacturing a fin transistor structure of claim 1, wherein before performing doping processing on the upper part of the fin part, the method further comprises:

forming a gate structure on the upper part of the fin part; and performing doping processing on a region, exposed outside the gate structure, of the upper part of the fin part.

11. A fin transistor structure, the fin transistor structure being manufactured by the method for manufacturing a fin transistor structure of claim 1.

12. The method for manufacturing a fin transistor structure of claim 1, wherein the doping gel contains a doping element.

13. The method for manufacturing a fin transistor structure of claim 1, wherein a LDD region that extends partially into the upper part of the fin part from a surface.

14. The method for manufacturing a fin transistor structure of claim 13, wherein at least one of the source region or the drain region is formed throughout the entire thickness of the fin part.

15. The method for manufacturing a fin transistor structure of claim 13, wherein at least one of the source region or the drain region is formed to extend from a surface of the fin partially into an upper portion of the fin.

* * * * *